(12) United States Patent
Jaeger et al.

(10) Patent No.: US 10,033,370 B2
(45) Date of Patent: Jul. 24, 2018

(54) CIRCUIT AND METHOD FOR DRIVING A POWER SEMICONDUCTOR SWITCH

(71) Applicant: Infineon Technologies AG, Neubiberg (DE)

(72) Inventors: Christian Jaeger, Munich (DE); Johannes Georg Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 15 days.

(21) Appl. No.: 14/737,541

(22) Filed: Jun. 12, 2015

(65) Prior Publication Data

US 2015/0365083 A1 Dec. 17, 2015

(30) Foreign Application Priority Data

Jun. 16, 2014 (DE) .................. 10 2014 108 451

(51) Int. Cl.
*H03K 3/00* (2006.01)
*H03K 17/14* (2006.01)
(Continued)

(52) U.S. Cl.
CPC ......... *H03K 17/14* (2013.01); *H03K 17/0828* (2013.01); *H03K 17/567* (2013.01); *H03K 17/687* (2013.01)

(58) Field of Classification Search
CPC ...... H03K 17/10; H03K 17/102; H03K 17/12; H03K 17/122; H03K 17/16; H03K 17/161;
(Continued)

(56) References Cited

U.S. PATENT DOCUMENTS

2013/0107688 A1* 5/2013 Cong .................. G11B 19/00
369/53.1
2014/0307495 A1* 10/2014 Fukuta .................. H02H 3/08
363/98

FOREIGN PATENT DOCUMENTS

CN 1234146 A 11/1999
CN 101394172 A 3/2009
(Continued)

OTHER PUBLICATIONS

Laszlo Balogh, "Design and application guide for high speed MOSFET gate drive circuits," in Proc. Power Supply Design Seminar (SEM 1400), 2001.*

*Primary Examiner* — Patrick Chen
(74) *Attorney, Agent, or Firm* — Murphy, Bilak & Homiller, PLLC

(57) ABSTRACT

A drive circuit for driving a semiconductor switch includes an overload detector circuit connected to the semiconductor switch and designed to detect an overload state of the semiconductor switch. The drive circuit further includes a driver circuit connected to a control terminal of the semiconductor switch and designed to generate, upon detection of an overload state, a driver signal having a level such that the semiconductor switch is switched off or switch-on is prevented. The driver circuit is further designed to generate a driver signal for driving the semiconductor switch according to a control signal, wherein for switching on the transistor at a first instant a driver signal is generated at a first level and, if no overload state is detected up to a predefined time period having elapsed, the level of the driver signal is increased to a second level.

16 Claims, 4 Drawing Sheets

(51) Int. Cl.
*H03K 17/082* (2006.01)
*H03K 17/567* (2006.01)
*H03K 17/687* (2006.01)

(58) Field of Classification Search
CPC .... H03K 17/30; H03K 17/302; H03K 19/003; H03K 19/00307; H03K 19/00315; H03K 19/00346; H03K 19/00353; H03K 19/00361; H04L 25/026
USPC ......................................................... 327/109
See application file for complete search history.

(56) References Cited

FOREIGN PATENT DOCUMENTS

| | | |
|---|---|---|
| CN | 101401308 A | 4/2009 |
| CN | 103248347 A | 8/2013 |
| CN | 103647538 A | 3/2014 |

\* cited by examiner

CIRCUIT AND METHOD FOR DRIVING A POWER SEMICONDUCTOR SWITCH

PRIORITY CLAIM

This application claims priority to German Patent Application No. 10 2014 108 451.9 filed on 16 Jun. 2014, the content of said application incorporated herein by reference in its entirety.

TECHNICAL FIELD

The present invention relates to a drive circuit for a power semiconductor switch such as an IGBT, and to a corresponding drive method.

BACKGROUND

Power semiconductor switches such as IGBTs (insulated gate bipolar transistors) or MOSFETs are used nowadays in a multitude of applications, for example in converter circuits. Independently of the specific use of a power semiconductor switch, a robust behavior in the case of short circuits is often desired. In the case of a short-circuited load, a switched-on power semiconductor switch is in the short-circuit operating mode, i.e., a high short-circuit current flows through the power semiconductor switch while at the same time a high voltage drop (usually equal to the intermediate circuit voltage in the case of a converter) across the load current path of the power semiconductor switch. The consequence is a very high power loss in the power semiconductor switch and correspondingly high heating above a critical temperature, which results in thermal runaway and thus the destruction of the power semiconductor switch.

In order to prevent destruction of the power semiconductor switch in the short-circuit operating mode (or generally in an overload operating mode), the power semiconductor switch has to be turned off after a specific time (e.g., 10 μs), in order that the energy (short-circuit current times operating voltage times time) dissipated during the overload operating mode remains below a critical value, wherein this critical energy is dependent on the specific construction of the power semiconductor switch. In order to prevent thermal runaway, the power semiconductor switch can be driven such that the short-circuit current does not exceed a defined maximum value and, consequently, the critical energy is not exceeded up to the turn-off of the power semiconductor switch. However, this can adversely affect the performance (e.g., with regard to the losses in the switched-on state) in the normal operating mode of the power semiconductor switch.

SUMMARY

The problem addressed by the invention can be considered that of providing an improved drive circuit and an improved drive method for power semiconductor switches such as IGBTs which, firstly, prevent thermal runaway in the short-circuit operating mode and, secondly, enable a good performance of the power semiconductor switch in the normal operating mode.

A drive circuit for driving a semiconductor switch is disclosed. According to an embodiment, the drive circuit includes an overload detector circuit connected to the semiconductor switch and designed to detect an overload state of the semiconductor switch. The drive circuit further includes a driver circuit connected to a control terminal of the semiconductor switch and designed to generate, upon detection of an overload state, a driver signal having a level such that the semiconductor switch is switched off or switch-on is prevented. The driver circuit is furthermore designed to generate a driver signal for driving the semiconductor switch according to a control signal, wherein, for switching on the transistor at a first instant, a driver signal is generated at a first level and, if no overload state is detected up to a predefined time period having elapsed, the level of the driver signal is increased to a second level.

A method for driving a semiconductor switch is further disclosed. According to an embodiment, the method includes monitoring the semiconductor switch with regard to the occurrence of an overload state, and switching on the semiconductor switch by generating a driver signal, which is fed to the control input of the semiconductor switch. At a first instant a driver signal having a first level is generated in order to switch on the semiconductor switch. The level is increased to a second level if no overload state occurs up to a predefined time period having elapsed.

BRIEF DESCRIPTION OF THE DRAWINGS

The invention is explained in greater detail below on the basis of the examples illustrated in the figures. The illustrations are not necessarily true to scale and the invention is not just restricted to the exemplary embodiments and aspects illustrated. Rather, importance is attached to illustrating the principles underlying the invention.

In the figures, identical reference signs designate identical or similar components or signals having an identical or similar meaning.

DETAILED DESCRIPTION

Figure 1:
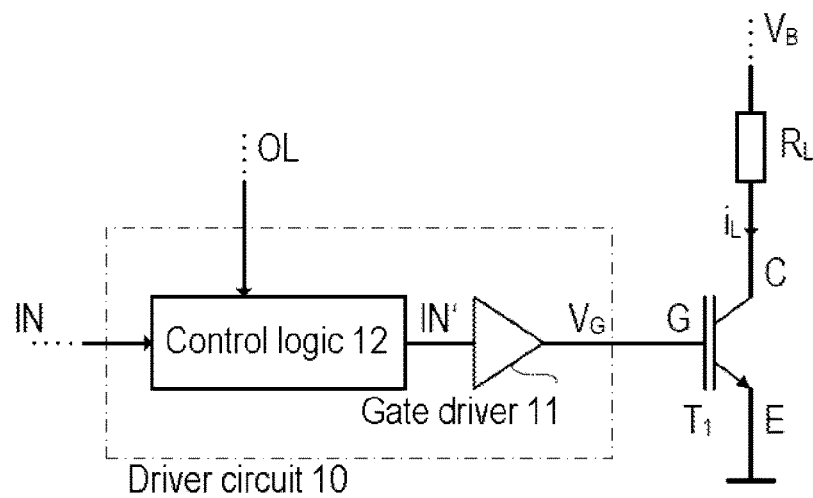
FIG. 1 is a circuit diagram showing one example of a drive circuit for driving an IGBT, according to an embodiment.

A power semiconductor switch $T_1$ and a drive circuit 10 connected thereto are illustrated in a circuit diagram in FIG. 1. In the examples illustrated, an IGBT is shown as power semiconductor switch, but, as already mentioned, other types of transistors (e.g., MOSFETs) can also be used as power semiconductor switches. In accordance with FIG. 1, the IGBT $T_1$ is embodied as a low-side switch, that is to say that the IGBT $T_1$ is connected between a load and a reference potential terminal GND, which is at a reference potential (ground potential). The load is designated by $R_L$ and is connected between the IGBT $T_1$ and a supply voltage terminal (at operating voltage $V_B$). A first load terminal of the IGBT $T_1$, which is connected to the load $R_L$, is designated as the collector terminal, and a second load terminal of the IGBT, which is connected to the reference potential terminal GND, is designated as the emitter terminal. In the case of a MOSFET, the load terminals are usually called drain terminal and source terminal. The low-side configuration illustrated should be understood just as an example. The IGBT $T_1$ can also be operated as a high-side switch or in a bridge circuit. The specific use of the power semiconductor switch is not relevant to the further discussion.

A drive circuit 10 is connected to a control terminal G of the power semiconductor switch, which is designated as a gate terminal in the case of an IGBT. A (binary) control signal IN is fed to the drive circuit 10 as input signal, and the drive circuit 10 is designed to generate a driver signal $V_G$ for driving the IGBT $T_1$ according to the control signal IN. The driver signal $V_G$ is fed to the gate terminal G of the IGBT $T_1$ (directly or via a resistor). The drive circuit 10 may include a control logic 12, and a gate driver 11. The gate driver 11 generates the driver signal for the IGBT $T_1$ from a modified, binary control signal IN', said driver signal in the present example being the gate voltage $V_G$ (relative to the potential of the emitter terminal E). Depending on the logic level of the modified control signal IN', the gate driver generates as driver signal, for example, a gate voltage $V_G$ of 0V for deactivating/turning off the IGBT and a gate voltage $V_G$ of 12 V or 15 V for activating/switching on the IGBT $T_1$. The actual values are dependent on the application and the power semiconductor switch used.

In the simplest case, the control logic 12 forwards the control signal IN to the gate driver 11 and brings about, if necessary, a logic level conversion or an adaptation of the logic level. In the present example, the control logic 12 logically combines the control signal IN with an overload signal OL indicating an overload state of the IGBT $T_1$. By way of example, a logic level OL=1 signals an overload state of the IGBT $T_1$ (e.g., in the short-circuit operating mode of the IGBT) and a logic level OL=0 signals a normal operating mode. In this case, the control logic 12 is designed to logically combine the control signal IN and the overload signal OL such that in the normal operating mode (OL=0) the modified control signal IN' is equal to the control signal IN. In the overload operating mode (OL=1), however, the control signal IN is blanked and the modified control signal IN' is zero. Written as a Boolean equation, this relationship reads $$IN'=IN \text{ AND(NOT } OL), \quad (1)$$

wherein AND denotes an ANDing and NOT denotes a negation. That is to say, that the IGBT $T_1$ is switched off (IN'=0)—or switch-on is prevented—as soon as an overload operating mode (OL=1) is detected and indicated.

In the normal operating mode, in the switched-on state of the IGBT, the load current $i_L$ thereof is limited by the operating voltage $V_B$ and the load (load resistance $R_L$). The load current $i_L$ is $(V_B-V_{CE,SAT})/R_L$, wherein the saturation voltage $V_{CE,SAT}$ (also forward voltage) denotes the minimum collector-emitter voltage $V_{CE}$ in the switched-on state of the IGBT. The power loss $P_V$ dissipated in the IGBT in the normal operating mode is $P_V=i_L \cdot V_{CE,SAT}$. In the switched-on state, for a given gate voltage $V_G$, the IGBT can carry a specific maximum load current $i_L$, which is designated as the saturation current $i_{L,SAT}$. Since, in the case of a short circuit, the full operating voltage $V_B$ is dropped across the collector-emitter current path (load current path) of the IGBT $T_1$ ($V_{CE}=V_B$), the load current $i_L$ normally rises up to the saturation current $i_{L,SAT}$. For the power loss $P_{MAX}$ during the short-circuit operating mode, $P_{MAX}=V_B \cdot i_{L,SAT}$ holds true. The time between the occurrence of an overload or a short circuit and the turn-off of the IGBT $T_1$ is designated by $t_{SC}$. For the resulting energy $E_{MAX}$ dissipated in the short-circuit operating mode, $$E_{MAX}=V_B \cdot i_{L,SAT} \cdot t_{SC}, \quad (2)$$

then holds true, wherein said energy $E_{MAX}$ is intended to remain below the critical energy $E_{CRIT}$ mentioned in the introduction, in order to prevent thermal runaway of the IGBT. The operating voltage $V_B$ is usually predefined by the application. The time $t_{SC}$ required for the detection of a short circuit and the subsequent turn-off of the transistor essentially depends on external parameters. Consequently, the inequality $E_{MAX}<E_{CRIT}$ predefines an upper limit value for the saturation current $i_{L,SAT}$, which, however, in the normal operating mode, results in a higher saturation voltage $V_{CE,SAT}$ and thus higher losses. There is therefore a conflict of aims between good performance in the normal operating mode, on the one hand, and the required short-circuit strength, on the other hand.

The saturation current $i_{L,SAT}$ and the saturation voltage $V_{CE,SAT}$ of an IGBT (and also of a MOSFET) are dependent on the gate voltage $V_G$ present at the gate terminal (i.e., the voltage level of the output signal of the gate driver 12). If the gate voltage $V_G$ is only slightly greater than the threshold voltage $V_{TH}$ of the IGBT, the saturation current $i_{L,SAT}$ is comparatively small and the saturation voltage $V_{CE,SAT}$ is comparatively large. The higher the gate voltage $V_G$ applied to the gate terminal G, the higher the saturation current $i_{L,SAT}$ becomes and the lower the saturation voltage $V_{CE,SAT}$ (and also the losses in the normal operating mode). The relationship between saturation voltage $V_{CE}$, SAT and gate voltage $V_G$ is nonlinear and, starting from a specific level of the gate voltage $V_G$, the further increase in the voltage level no longer leads to a significant reduction of the saturation voltage $V_{CE,SAT}$.

Figure 2:
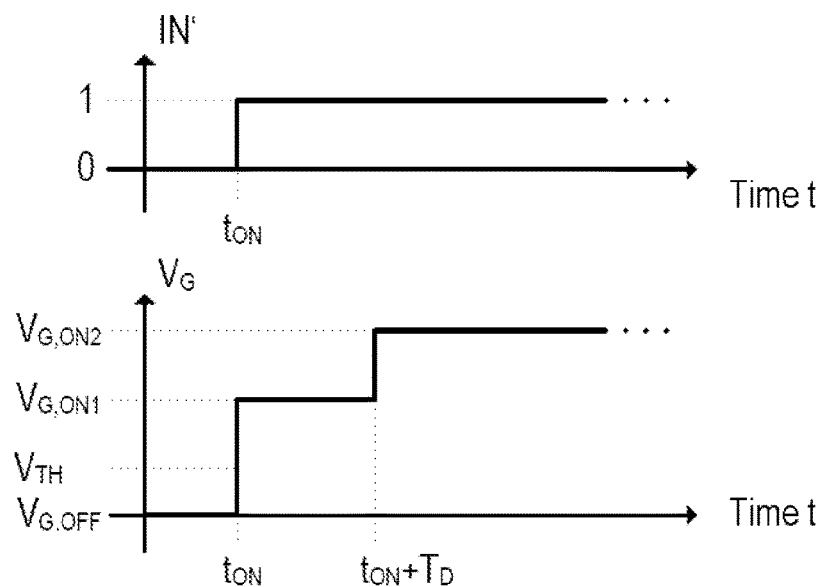
FIG. 2 illustrates, on the basis of timing diagrams, one exemplary profile of the control signal and of the gate voltage during a switch-on process of an IGBT, according to an embodiment.

The two timing diagrams in FIG. 2 show the input signal (control signal) IN (or the modified control signal IN' in the normal operating mode) and the associated gate driver signal (gate voltage) $V_G$ in accordance with a first exemplary embodiment. The signals illustrated can be generated by a drive circuit constructed in a similar manner to the circuit from FIG. 1. The control signal IN is initially at a low logic level (low level, "logic 0"), for which reason the IGBT $T_1$ is switched off. The gate driver 12 "sees" an input signal IN' having a low logic level and therefore generates a gate driver signal $V_G$ having a voltage level $V_{G,OFF}$ (e.g., $V_{G,OFF}=0$) which is low enough ($V_{G,OFF}<V_{TH}$) to switch off the IGBT $T_1$ or to keep it switched off. At the instant $t_{ON}$, the level of the control signal IN changes to a high logic level (high level, "logic 1"), as a result of which a switch-on process of the IGBT is initiated. The gate driver 12 (cf. FIG. 1 and FIG. 4) "sees" an input signal IN' and therefore generates a gate driver signal $V_G$ having a voltage level $V_{GON1}$ that is high enough ($V_{G,ON1}<V_{TH}$) to switch on the IGBT $T_1$. The voltage level $V_{G,ON1}$ of the driver signal $V_G$ corresponds to a specific saturation current $i_{L,SAT}$. In the case of a short circuit of the load (in the short-circuit operating mode) this results in a short-circuit current $i_{MAX1}=i_{L,SAT}(V_{G,ON1})$ and a corresponding energy $E_{MAX1}=V_B \cdot i_{MAX1} \cdot t_{SC1}$ (cf. equation 2), wherein the short-circuit current $i_{MAX1}$ is directly related to the voltage level $V_{G,ON1}$ of the driver signal.

The drive circuit 10 is designed to turn off the IGBT $T_1$ or to keep it turned off (i.e., to prevent switch-on) if an overload (e.g., a short circuit) is detected (cf. FIG. 1, overload signal OL=1). If no overload is detected within a predefined time $T_D$ (after the instant $t_{ON}$), the level of the gate driver signal $V_G$ is increased from $V_{G,ON1}$ to $V_{G,ON2}$ ($V_{G,ON2} > V_{G,ON1}$). As explained above, in the normal operating mode this results in a lower saturation voltage $V_{CE,SAT}$, and in the case of a short circuit of the load this results in a higher short-circuit current $i_{MAX2} = i_{L,SAT}(V_{G,ON2})$ and a corresponding energy $E_{MAX2} = V_B \cdot i_{MAX2} \cdot t_{SC2}$ (cf. equation 2), wherein the short-circuit current $i_{MAX2}$ is directly related to the voltage level $V_{G,ON2}$ of the driver signal. The energy values $E_{MAX1}$ and $E_{MAX2}$ must not exceed the critical value $E_{CRIT}$ in order to avoid thermal runaway. In the limiting case, $E_{CRIT} = E_{MAX1} = E_{MAX2}$ holds true. It follows from this that $$t_{SC1} = E_{CRIT}/(i_{MAX1} \cdot V_B), \text{ and} \qquad (3)$$

$$t_{SC2} = E_{CRIT}/(i_{MAX2} \cdot V_B) \qquad (4)$$

This in turn means that in the case of a lower short-circuit current $i_{MAX1}$ (saturation current $i_{L,SAT}$ at $V_{G,ON1}$) the duration $t_{SC1}$ of a short circuit is permitted to be greater without violating the inequality $E_{MAX1} < E_{CRIT}$.

The two-stage driving of the gate terminal G when switching on the IGBT as illustrated in FIG. 2 has the consequence that in a first time interval having the length $T_D$ after the instant $t_{ON}$ the "allowed" duration of a possible short circuit is greater than for instants after the instant $t_{ON} + T_D$, at which a driver signal having a high voltage level $V_{G,ON2}$ is present at the gate terminal G of the IGBT $T_1$. This approach affords the possibility of having available for the detection of short circuits that already exist upon switch-on (i.e., at the instant $t_{ON}$) more time (namely a time $T_D \leq t_{SC1}$) than for the detection of short circuits that occur later (instants later than $t_{ON} + T_D$). A short circuit that already exists upon switch-on is designated hereinafter as "type I" short circuit, whereas a short circuit that occurs later with the IGBT switched on is designated as "type II" short circuit. It is often desirable to have a comparatively long time available for the detection of a type I short circuit, in order to enable a reliable differentiation between a "normal" high switch-on current (on account of the start-up behavior of the load) and a "faulty" high switch-on current (on account of a type I short circuit). Typically, a reliable detection can be carried out in the order of magnitude of e.g., 10 µs, for which reason the interval $T_D = 10$ µs can be set in the above example from FIG. 2. The short-circuit duration $t_{SC1}$ "allowed" in this phase must be greater than or equal to the time interval $T_D$. From the assumption (limiting case) $t_{SC1} = T_D = 10$ µs, for a given operating voltage, it is possible to derive an associated value for the saturation current $i_{L,SAT}$ and an associated level $V_{G,ON1}$ of the driver signal.

In the case of a short circuit that occurs later, the problem of distinguishing between "normal" switch-on current and short-circuit current does not arise, for which reason it is possible to react to a short circuit much faster. In this phase, the "allowed" short-circuit duration $t_{SC2}$ can be reduced to e.g., 2 µs, which enables a correspondingly higher saturation current $i_{L,SAT}$, a lower saturation voltage $V_{CE,SAT}$ and a higher level $V_{G,ON2}$ of the driver signal $V_G$. This in turn results in better performance (lower losses $P_V = V_{CE,SAT} \cdot i_L$) in the normal operating mode. By way of example, the gate voltage $V_G$ at the instant $t_{ON}$ ($V_{G,ON1}$) can be 12 V or 15 V. For instants after $t_{ON} + T_D$, the gate voltage $V_G$ ($V_{G,ON2}$) can be e.g., between 1 and 5 volts higher.

Figure 3:
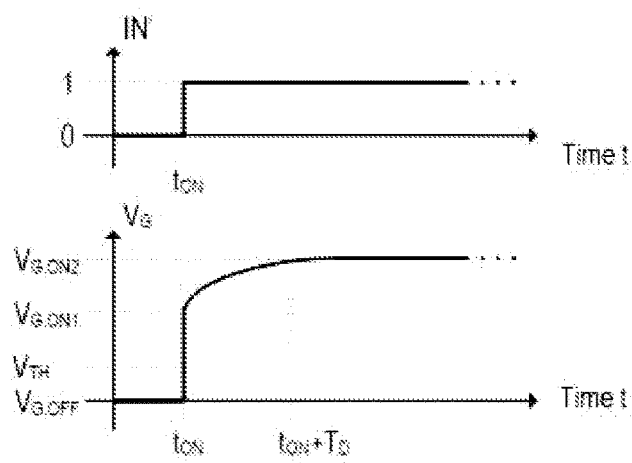
FIG. 3 illustrates, on the basis of timing diagrams, a further exemplary profile of the control signal and of the gate voltage during a switch-on process.

FIG. 3 likewise comprises timing diagrams showing the profiles of the input signal IN (corresponds to the modified control signal IN' in the normal operating mode) and of the associated gate driver signal (gate voltage) $V_G$ in accordance with a further example of the invention. The above-explained effects of the two-stage driving in accordance with FIG. 3 do not necessarily presuppose a constant voltage level of the driver signal $V_G$ between the instants $t_{ON}$ and $t_{ON} + T_D$. The level of the driver signal can also be continuously changed between these two instants. In accordance with the example shown in FIG. 3, the drive circuit 12 generates at the instant $t_{ON}$ a driver signal having a level $V_{G,ON1}$ (and thus switches on the IGBT), which then rises continuously (not in a stepwise mode) to the value of (approximately $V_{G,ON2}$ until the instant $t_{ON} + T_D$. Consequently, at the instant $t_{ON} + T_D$ the saturation voltage $V_{CE,SAT}$ does not decrease abruptly, but rather continuously from $V_{CE,SAT}(V_{G,ON1})$ to $V_{CE,SAT}(V_{G,ON2})$. A transition in a plurality of steps would also be possible.

Figure 4:
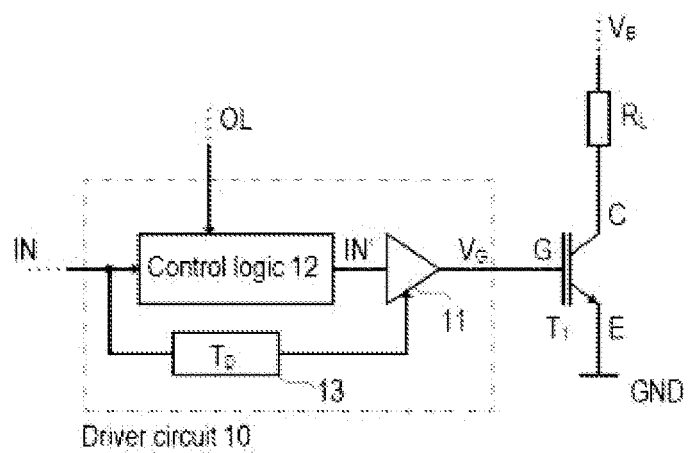
FIG. 4 is a circuit diagram showing a drive circuit in accordance with a first example of the invention, according to an embodiment.

FIG. 4 shows an IGBT $T_1$ with a drive circuit 10 similar to the drive circuit from FIG. 1. The drive circuit 10 in accordance with FIG. 4 is constructed identically to the circuit in accordance with the example from FIG. 1, wherein a delay unit 13 is additionally provided, which is designed to increase a gain of the output stage of the gate driver 11 until a time interval $T_D$ has elapsed after the instant $t_{ON}$ or during said time interval $T_D$ (e.g., in a stepwise manner or continuously). In the present case, the input signal IN is fed to a control input of the gate driver 11 in a manner delayed by a time $T_D$ by means of the delay unit 13. At an instant $t_{ON}$, the gate driver 11 generates a gate voltage $V_G$ having a first level $V_{G,ON1}$. It is only after the delay time $T_D$ has elapsed that a logic level of IN"=1 is present at the control input of the gate driver 11, as a result of which the gain of the gate driver 11 is increased and the level of the gate voltage rises to the value $V_{G,ON2}$. The circuit in accordance with FIG. 4 thus brings about a signal profile of the gate voltage $V_G$ in accordance with FIG. 2. Alternatively, the delay unit 13 could be designed to increase the gain of the gate driver 11 continuously, which would result in a signal profile in accordance with FIG. 3.

Figure 5:
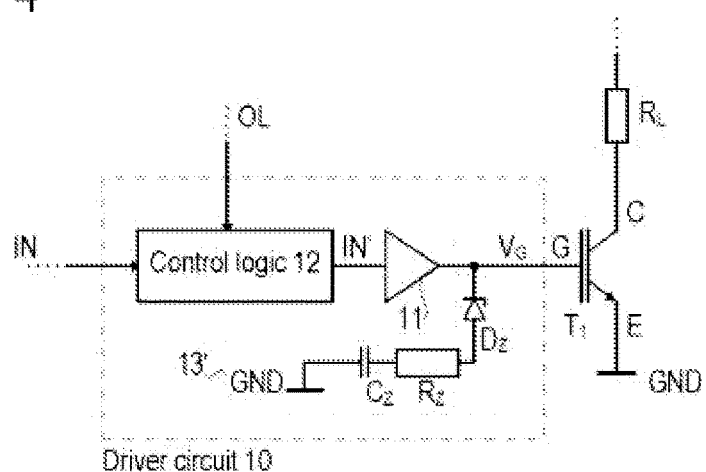
FIG. 5 is a circuit diagram showing a drive circuit in accordance with a further example of the invention.

FIG. 5 shows an alternative to the example from FIG. 4, wherein, instead of the delay unit 13, a delay element 13' is connected to the output of the gate driver 13. The delay element comprises only passive electronic components, for example, in the present case a series circuit comprising a zener diode $D_Z$, a capacitor $C_Z$ and an (optional) resistor $R_Z$. The series circuit is connected between the output of the gate driver circuit 11 and the emitter terminal E of the IGBT, which is connected to the ground terminal GND in the present case of a low-side switch. The zener voltage $U_Z$ of the zener diode $D_Z$ substantially corresponds to the first (lower) voltage level $V_{G,ON1}$ of the gate driver signal $V_G$, and resistor $R_Z$ and capacitor $C_Z$ form a first-order RC delay element having a time constant of $((R_Z + R_G)C_Z)^{-1}$, wherein $R_G$ denotes the output resistance (not illustrated) of the output stage of the gate driver 11. In the case of control signal IN'=1, the gate driver 11 in the present example generates a voltage level of $V_G = V_{G,ON2}$, which is limited initially—with capacitor $C_Z$ discharged—to the value of the zener voltage $U_Z = V_{G,ON1}$. The difference voltage $V_{G,ON2} - V_{G,ON1}$ is dropped across the output resistance $R_G$ (not illustrated, but see FIG. 8) of the output stage of the gate driver 11 and the resistor $R_Z$. The capacitor $C_Z$ is charged via the zener diode $D_Z$ and the resistor $R_Z$ and also the output resistance $R_G$ of the gate driver 11 and the resistor $R_Z$ and the level at the output of the gate driver 11 rises continuously up to the value $V_{G,ON2}$ in the meantime. This results in a profile of the driver signal $V_G$ corresponding to the example from FIG. 3.

Figure 6:
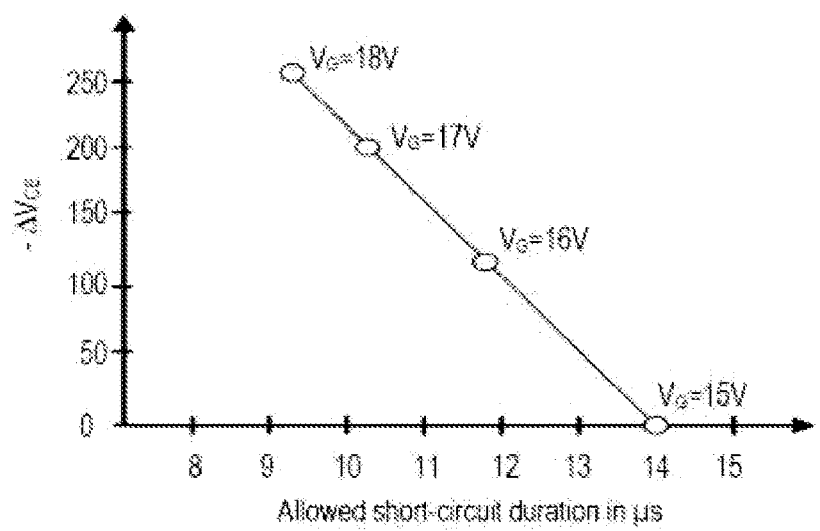
FIG. 6 is a diagram illustrating the relationship between gate voltage level and allowed short-circuit duration, according to an embodiment.

FIG. 6 shows the improvement (reduction) in the collector-emitter saturation voltage $V_{CE,SAT}$ for different gate voltages $V_G$ and to the corresponding "allowed" short-circuit time durations $t_{SC}$. Proceeding from a given collector-emitter saturation voltage $V_{CE,SAT}$ at a gate voltage $V_G$ of 15V and an allowed short-circuit duration $t_{SC}$ of 14 µs, the collector-emitter saturation voltage $V_{CE,SAT}$ decreases by approximately 110 mV ($\Delta V_{CE}$=−110 mV) at a gate voltage $V_G$ of 16 V, by approximately 200 mV ($\Delta V_{CE}$=−200 mV) at a gate voltage $V_G$ of 17 V and by approximately 250 mV ($\Delta V_{CE}$=−250 mV) at a gate voltage $V_G$ of 18 V. The allowed short-circuit duration correspondingly decreases to approximately 11.7 µs (at $V_G$=16V), 10.3 µs (at $V_G$=17V) and 9 µs (at $V_G$=18V).

The two-stage (or multi-stage) driving of the gate of an IGBT as described in association with FIGS. 2 to 5 allows in the switch-on phase (i.e., in the time interval $T_D$ ($T_D \geq t_{SC1}$) directly after the switch-on of the IGBT) a comparatively long time $t_{SC1}$ for identifying a short circuit (type I) already present upon switch-on. After this switch-on phase, the gate voltage $V_G$ is increased further (provided that no short circuit was identified), as a result of which the collector-emitter saturation voltage $V_{CE,SAT}$ is reduced in accordance with FIG. 6 and the power loss is thus reduced. A significantly shorter allowed short-circuit duration $t_{SC2}$ ($t_{SC2} < t_{SC1}$) is accepted here since it is possible to react faster to a short circuit (type II) during operation since the problem of distinguishing between normal start-up current and short-circuit current does not arise.

Figure 7:
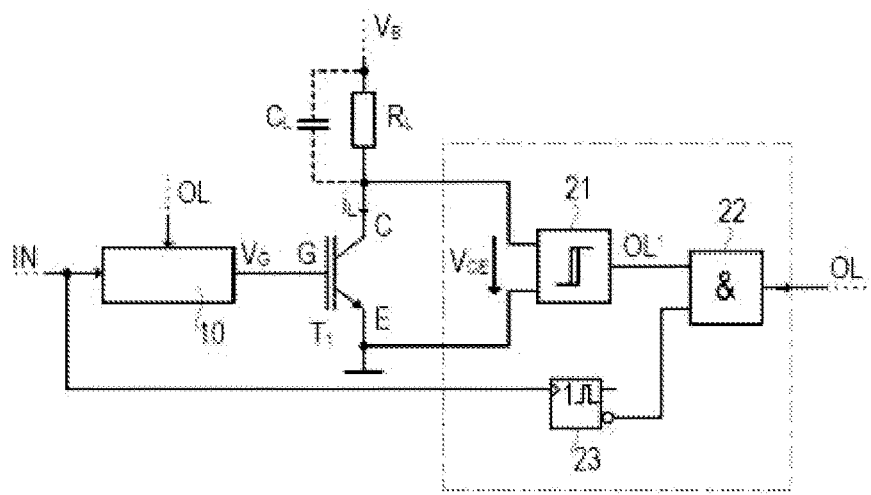
FIG. 7 is a circuit diagram showing one example of a circuit for detecting short circuits, according to an embodiment.

FIG. 7 shows one example of a circuit 20 for detecting type I and type II short circuits (overload detection circuit) and for generating an overload signal OL, which can be fed e.g., to the driver circuit in accordance with FIG. 1. FIG. 7 shows—like FIG. 1 already—an IGBT $T_1$ in a low-side configuration with a driver circuit 10, which generates a gate signal $V_G$ depending on a (binary) input signal IN and an overload signal OL (for example as in FIG. 4 or 5). FIG. 7 additionally shows an overload detection circuit 20, which is connected to the IGBT $T_1$. In the present example, the circuit 20 comprises a comparator 21, to which the collector-emitter voltage $V_{CE}$ of the IGBT $T_1$ is fed as input signal and which generates a comparator output signal OL'. The comparator 21 can have a hysteresis in order to avoid toggling, i.e., the overload signal OL switches from 0 to 1 if the collector-emitter voltage $V_{CE}$ reaches or exceeds a first reference value $V_{REF1}$ and the overload signal switches from 1 to 0 if the collector-emitter voltage $V_{CE}$ reaches or falls below a second reference value $V_{REF2}$, wherein $V_{REF1} > V_{REF2}$. In the limiting case $V_{REF1} = V_{REF2}$ the comparator has no hysteresis. The reference values lie between the saturation voltage $V_{CE,SAT}$ and the operating voltage $V_B$, such that $V_{CE} < V_{REF2}$ and OL'=0 hold true in the normal operating mode ($V_{CE} = V_{CE,SAT}$). In the case of a short circuit, the collector-emitter voltage $V_{CE}$ rises from $V_{CE,SAT}$ up to the operating voltage $V_B$ and $V_{CE} > V_{REF1}$ and OL=1 hold true. For this reason, the comparator 21 can also be designated as a desaturation detector.

The comparator output signal OL' could already be used to identify type II short circuits. However, short circuits that are already present upon the switch-on of the IGBT $T_1$ (type I) cannot be readily be reliably distinguished from switch-on currents (which are very high under certain circumstances). High switch-on currents can occur e.g., if the load has a capacitive portion, for example (parasitic) line capacitances, which are symbolized by the capacitor CL in parallel with the load $R_L$ in FIG. 7. A reliable overload detection is only possible after transient switch-on currents have decayed (i.e., the line capacitances have been charged). In order to avoid incorrect detections, the comparator output signal OL' is blanked (masked out) for a specific time interval after a transition from IN=0 to IN=1. If an overload state is still identified after this time interval has elapsed, the comparator output signal OL' is output as overload signal OL and a short circuit is signaled (OL=1).

In the present example, a monostable multivibrator 23 is triggered by a rising edge of the input signal IN (transition from IN=0 to IN=1) and an inverted pulse (signal X) of defined length is generated. The outputs of the comparator 21 (signal OL'), and of the monostable multivibrator 23 (signal X) are fed to an And gate 22, the output signal of which is the overload signal OL. In the normal case, the comparator output signal OL' is looped through to the output of the And gate 22 since X=1. It is only for a short pulse duration—defined by the monostable multivibrator 23—after the switch-on of the IGBT $T_1$ that X=0 and hence also OL=0 independently of the comparator output signal OL'. As a result, a short circuit already present upon switch-on is identified only if an overload condition ($V_{CE} > V_{REF1}$) is (still) fulfilled after a predefined detection duration (defined e.g., by the monostable multivibrator 23).

The pulse duration of the monostable multivibrator 23 can be coordinated with the allowed short-circuit time $t_{SC}$ during the switch-on phase of the IGBT $T_1$ and thus with the delay time $T_D$ (see FIGS. 2 and 3). In this regard, the monostable multivibrator 23 can also be comprised by the delay unit 13 in FIG. 4. The delay time $T_D$ (see FIG. 2 or 4) can be chosen to be identical to the pulse duration of the monostable multivibrator 23.

As an alternative to the detection of an overload on the basis of the collector-emitter voltage $V_{CE}$, for overload detection the load current $i_L$ can also be measured directly or indirectly and compared with one or a plurality of reference values. In this case, too, the comparison result can be masked out within a short time (e.g., 10 µs) after the switch-on of the IGBT in order to avoid incorrect detections on account of high switch-on currents. The overload detector circuit 20 can also carry out a temperature measurement and also signal an overload if a critical temperature is exceeded.

The turning off of a very high load current $i_L$ (short-circuit current) can—if the IGBT is turned-off/deactivated very rapidly—result in an overvoltage on account of inductances in the load current circuit. Even unavoidable leakage inductances can result in the abovementioned overvoltages (voltage spikes), which can in turn cause a wide variety of problems (e.g., a latch-up of the IGBT). The switching times for switching an IGBT on and off are usually influenced with the aid of the output resistance (usually designated as gate resistance $R_G$) of the gate driver 11, wherein the switching time is substantially determined by the time constant $(R_G \cdot C_G)^{-1}$ of the RC element formed by the gate resistance $R_G$ and the gate capacitance $C_G$. A high gate resistance thus results in a longer switching time than a low gate resistance. In this case, the steepness of the current edge $|di_L/d_t|$ (absolute value of the current gradient) of the load current $i_L$ is set by way of the gate resistance.

In order to avoid the abovementioned voltage spikes, the gate resistance—depending on the maximum load current (short-circuit current)—can be designed to be high enough that a specific switching time is not undershot. During the turn-off of the IGBT, the current gradient $di_L/dt$ then remains in a non-critical range. In particular, for this purpose, a larger gate resistance can be chosen for turning off a high short-circuit current than for turning off from a nominal operating mode. At the same time, a slow turn-off also adversely affects the energy dissipated in the case of a short circuit. Since the maximum load current $i_L$ in the case of the exemplary embodiments described here is lower (owing to the lower gate voltage) in the case of the type I short circuit than in the case of the type II short circuit, in the event of turning off a load current in the case of a short circuit the gate resistance can be adapted to the maximum short-circuit current. This functioning of the gate driver 11 is depicted schematically by way of example in FIG. 8. This illustration does not necessarily correspond to the actual implementation of the circuit, but illustrates the desired function.

Figure 8:
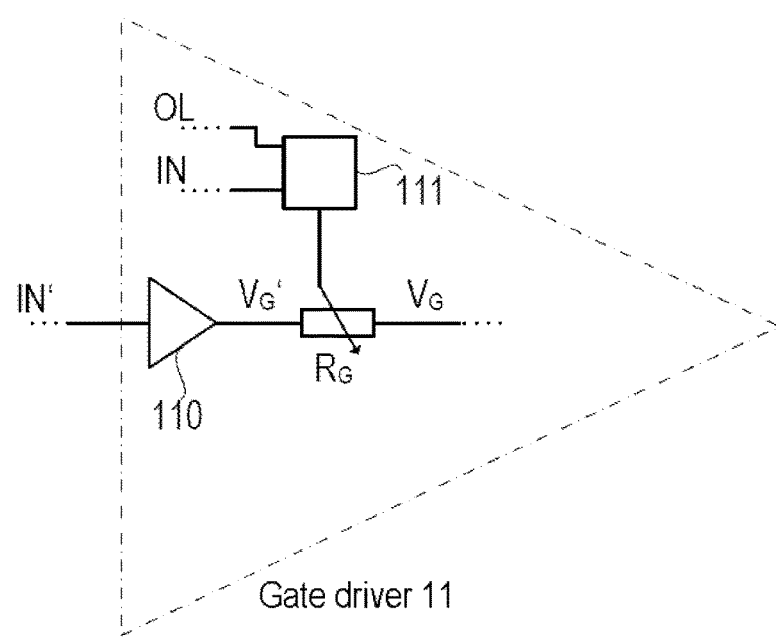
FIG. 8 is a circuit diagram for schematically illustrating the functioning of a gate driver, according to an embodiment.

FIG. 8 essentially shows an output stage 111 of the gate driver, which output stage generates a voltage $V_G'$, and a variable gate resistance $R_G$, which is connected downstream of the output stage and the resistance value of which is settable depending on the signals IN and OL (with the aid of the control logic 111). In the normal switching operating mode (OL=0), identical or different resistance values for $R_G$ can be set when switching the IGBT on and off. In the case of a turn-off on account of an overload, in any case during the time interval $T_D$ (from $t_{ON}$ to $t_{ON}+T_D$, see FIGS. 2 and 3) a lower gate resistance value is set than after the instant $t_{ON+}T_D$. The same result is obtained if the gate resistance value used when turning off an overload is set in a manner dependent on the gate voltage. By way of example, the resistance value $R_G$ can be increased if the gate voltage $V_G$ exceeds a defined threshold value (which lies between $V_{G,ON1}$ and $V_{G,ON2}$, e.g., ($V_{G,ON1}+V_{G,ON2}$)/2). Independently of the specific implementation, the switching time in the event of an "emergency turn-off" in the case of a short circuit (OL=1) will be dependent on the maximum short-circuit current (which is dependent in turn on the gate voltage). This adaptation of the switching time can be achieved by means of an adaptation (e.g., a changeover) of the gate resistance $R_G$. However, other approaches are also possible, e.g., the use of controlled current sources or the like.

In the case of the detection of an overload state, the gate driver generates the driver signal $V_G$ such that a (minimum, predefinable by the circuit design) switch-off time is not undershot. This minimum switch-off time can be directly or indirectly dependent on the level of the driver signal $V_G$ (see FIGS. 2 and 3, level $V_{G,ON1}$, $V_{G,ON2}$). By way of example, by adapting the effective gate resistance $R_G$, it is possible to reduce said switch-off time after the predefined time period $T_D$ has elapsed (cf. FIGS. 2 and 3).

The examples described here show an IGBT as power semiconductor switch. In many applications, IGBTs can readily be replaced by MOS transistors (power MOSFETs). The principles described here are applicable to MOSFETs and hence the invention is not restricted to application in association with IGBTs. The logic circuits presented can also be implemented differently than presented, without the effective function of the circuits being altered. In particular, circuits having inverted logic levels can be realized.

The invention claimed is:

1. A circuit for driving a semiconductor switch, comprising:
   an overload detector circuit connected to the semiconductor switch and designed to detect an overload state of the semiconductor switch,
   a drive circuit connected to a control terminal of the semiconductor switch and designed,
   to generate, upon detection of an overload state, a driver signal having a level such that the semiconductor switch is switched off or switch-on is prevented, and
   to generate the driver signal for driving the semiconductor switch according to a control signal, wherein, for switching on the transistor at a first instant, the driver signal is generated at a first level and, only if no overload state is detected up to a predefined time period having elapsed, the level of the driver signal is changed to a second level that maintains the semiconductor switch in an on state and lowers a forward voltage of the semiconductor switch.

2. The circuit as claimed in claim 1, wherein the overload state is detected if an overload condition is fulfilled over a specific detection duration.

3. The circuit as claimed in claim 2, wherein the detection duration is shorter after the predefined time period has elapsed than before said predefined time period has elapsed.

4. The circuit as claimed in claim 2, wherein the overload condition is fulfilled if a load current through the semiconductor switch or if a voltage drop across the semiconductor switch exceeds an associated reference value.

5. The circuit as claimed in claim 1, wherein the drive circuit comprises a gate driver designed to generate the driver signal for driving the semiconductor switch according to the control signal, wherein the gate driver has an adjustable gain.

6. The circuit as claimed in claim 1, wherein the drive circuit comprises a gate driver designed to generate the driver signal for driving the semiconductor switch according to the control signal, wherein an output resistance of the gate driver is loaded with an RC element and the control input of the semiconductor switch.

7. The circuit as claimed in claim 1, wherein in the case of detection of an overload state the driver signal is generated such that a current edge steepness is not exceeded.

8. The circuit as claimed in claim 7, wherein a switch-off time of the semiconductor switch is directly or indirectly dependent on the level of the driver signal.

9. The circuit as claimed in claim 7, wherein a switch-off time of the semiconductor switch is reduced after the predefined time period has elapsed.

10. The circuit as claimed in claim 7, wherein the drive circuit has a gate driver having an output resistance which is dimensioned or adaptable such that the current edge steepness is not exceeded.

11. A method for driving a semiconductor switch, comprising:
    monitoring the semiconductor switch with regard to the occurrence of an overload state;
    switching on the semiconductor switch by generating a driver signal having first level, said driver signal being fed to a control input of the semiconductor switch, and
    changing the level of the driver signal to a second level that maintains the semiconductor switch in an on state and lowers a forward voltage of the semiconductor switch only if no overload state occurs up to a predefined time period having elapsed.

12. The method as claimed in claim 11, wherein monitoring the semiconductor switch with regard to the occurrence of an overload state comprises:
    signaling an overload state if an overload condition is fulfilled over a specific detection duration,
    wherein, after the semiconductor switch has been switched on, the detection duration is shorter after the predefined time period has elapsed than before said predefined time period has elapsed.

13. The method as claimed in claim 11, wherein in the case of detection of an overload state the semiconductor switch is turned off such that a current edge steepness is not exceeded.

14. The method as claimed in claim 13, wherein the switch-off time is dependent on the elapsing of the predefined time period or on the level of the driver signal.

15. The method as claimed in claim 11, wherein switching on the semiconductor switch comprises generating a first gate voltage at an input of the semiconductor switch that exceeds a threshold voltage of the semiconductor switch, and wherein changing the level of the driver signal comprises generating a second gate voltage at the input of the semiconductor switch that exceeds the first gate voltage only if no overload state is detected and a predefined time period has elapsed.

16. A circuit for driving a semiconductor switch, comprising:

an overload detector circuit connected to the semiconductor switch and designed to detect an overload state of the semiconductor switch, a drive circuit connected to a control terminal of the semiconductor switch and configured to switch the semiconductor switch OFF or on;

wherein the drive circuit is configured to perform a two-stage turn-on process, the two-stage turn-on process comprising:

generating a first gate voltage at an input of the semiconductor switch that exceeds a threshold voltage of the semiconductor switch; and generating a second gate voltage at the input of the semiconductor switch that exceeds the first gate voltage only if no overload state is detected and a predefined time period has elapsed.

\* \* \* \* \*